United States Patent
Achari et al.

(10) Patent No.: US 6,454,878 B1
(45) Date of Patent: Sep. 24, 2002

(54) CLADDED MATERIAL CONSTRUCTION FOR ETCHED-TRI-METAL CIRCUITS

(75) Inventors: Achyuta Achari, Canton, MI (US); Brenda Joyce Nation, Troy, MI (US); Jay D Baker, Dearborn, MI (US); Lakhi Nandlal Goenka, Ann Arbor, MI (US); Mohan R. Paruchuri, Canton, MI (US); Vladimir Stoica, Farmington Hills, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 85 days.

(21) Appl. No.: 09/703,553

(22) Filed: Nov. 1, 2000

(51) Int. Cl.[7] ................................................. C23C 8/06
(52) U.S. Cl. ........................... 148/284; 216/13; 216/20; 29/830
(58) Field of Search .............................. 148/282, 284; 216/13, 20; 29/830

(56) References Cited

U.S. PATENT DOCUMENTS

| | | | |
|---|---|---|---|
| 3,801,388 A | 4/1974 | Akiyama et al. ............... 156/3 |
| 4,048,005 A | * 9/1977 | Nakagome et al. .......... 156/246 |
| 4,404,059 A | 9/1983 | Livshits et al. .............. 156/629 |
| 4,659,425 A | * 4/1987 | Eggers et al. ................ 156/322 |
| 5,738,797 A | 4/1998 | Belke, Jr. et al. .............. 216/16 |
| 5,976,391 A | * 11/1999 | Belke et al. ................... 216/13 |

\* cited by examiner

Primary Examiner—John Sheehan
Assistant Examiner—Andrew L. Oltmans
(74) Attorney, Agent, or Firm—John E. Kajander

(57) ABSTRACT

A method for forming sets of tri-metal material involving the use of cladding mills. When multiple sets of tri-metal material are formed, the outside surfaces of each set is prepared by oxidation to prevent each set from adhering to the set above or below. An alternative to oxidation is to provide a removable layer on the outside surface of the tri-metal material. Alternatively bonding materials may be used on the intermediate surfaces; such bonding materials can be selected from a group consisting of tin, nickel, titanium, chromium, silver and zinc.

11 Claims, 2 Drawing Sheets

CLADDED MATERIAL CONSTRUCTION FOR ETCHED-TRI-METAL CIRCUITS

BACKGROUND OF THE INVENTION

1. Field of the Invention

This invention relates generally to circuit boards and more particularly to a material construction for use in Etched-Tri-Metal, "ETM", multi-layer circuit boards.

2. Description of the Related Art

In the field of electronics manufacturing, various additive and subtractive processes that are known for constructing printed circuit boards (PCBs). Among these are the processes disclosed in U.S. Pat. No. 3,801,388 issued Apr. 2, 1974 to Akiyama et al. which is a subtractive process. U.S. Pat. No. 4,404,059 issued Sep. 13, 1983 to Livshits et al is an additive process. U.S. Pat. No. 5,738,797 issued Apr. 14, 1998 to Belke, Jr. et al is assigned to a common assignee. All three of which are incorporated herein by reference. These patents describe various additive and subtractive plating and chemical etching processes for constructing multi-layer PCBs having air bridges.

SUMMARY OF THE INVENTION

A method for cladding material for etched-tri-metal circuits to maintain the dimensional tolerance and reducing the stresses in the cladded material having the steps of first forming a stacked set of tri-metal material having three layers of metal. The central layer is one material, which is aluminum, and the top and bottom layers are a second material, which are copper.

Then each set of the tri-metal material have the outside surfaces of the top and bottom layers oxidized to prevent the sets from adhering together when they are stacked. Prior to being stacked, each set is fed through a cladding mill having a predetermined pressure and temperature. After exiting the cladding mill, the individual sets of the tri-metal material are stacked with the oxidized surfaces abutting each other.

Then the stacked sets are processed through a rolling mill at a predetermined pressure and temperature to reduce the thickness of the multiple set of tri-metal cladded material. After finishing rolling, the multiple set of tri-metal cladded material is separated into the individual sets of tri-metal material.

DETAILED DESCRIPTION

Cladded copper-aluminum-copper (Cu/Al/Cu) sheet or coil is used as a starting material for the subtractive process in Etched Trilayer metal, ETM, manufacturing.

Figure 4:
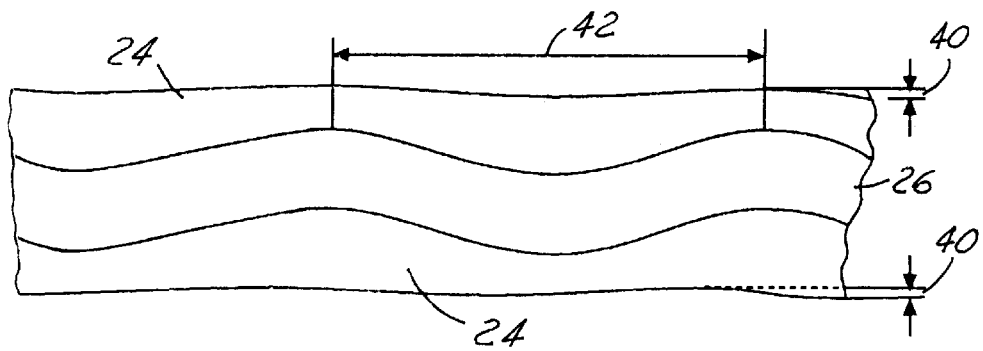
FIG. 4 is an expansive section view showing the washboard effect of tri-metals not processed according to this invention.

The process disclosed in U.S. Pat. No. 3,801,388 issued Apr. 2, 1974 to Akiyama et al. is a subtractive process. Uniformity in thickness of each layer and good adhesion between the layers is important for the manufacture of high quality and reliable ETM substrates. Currently available Cu/Al/Cu clad materials have a large variation, about 50%, in the thickness of the individual Cu and Al layers. This is illustrated in FIG. 4. In the manufacture of PCBs, an acceptable variation in individual layers thickness is a maximum of 10%.

To achieve this goal, uniform pressure on the clad material during the cladding process and control of the Cu—Al intermetallics growth is important. This invention provides new methods to manufacture high quality Cu/Al/Cu clad material sheets. These methods provide uniform pressure and at the same time control intermetallic growth during the cladding process.

Figure 1:
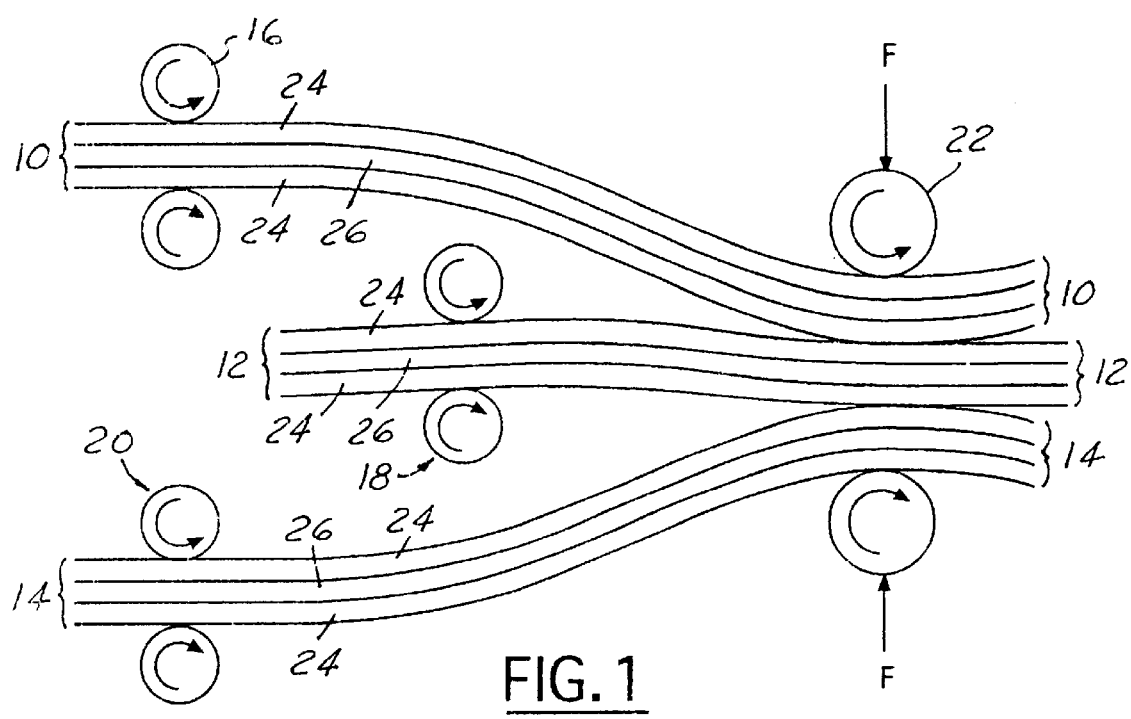
FIG. 1 is a schematic of cladding multiple sets of tri-metals.

Referring to the FIG. 1. there is illustrated a schematic of cladding multiple sets 10, 12, 14 of tri-metals in one or more cladding rolls 16, 18, 20 and then combining all of the sets in a rolling mill 22. The first set of tri-metal 10 is illustrated as being driven through a first pair of cladding rollers 16. The three sheets, a pair of outside or second metal layers 24 and a central or first metal layer 26 of the metals, are shown enlarged for the purposes of illustration. Aluminum is the central layer 26 and a pair of sheets or outside layer 24 of copper is cladded to both broadside surfaces of the aluminum.

As illustrated, there are three pairs of cladding rollers 16, 18, 20, each pair forming a cladding mill, as illustrated in FIG. 1. It is understood that the number of pairs of cladding rollers comprising a cladding mill is at the option of the fabricator. The cladding process applies a heavy pressure to the tri-metal 10 and causes a bonding of the three metals. Each of the sheets 24, 26 of metal is smooth prior to being fed into the cladding rollers 16, 18, 20. The heavy pressure of the cladding rollers not only reduces the thickness of the tri-metal set, but also introduces more waviness into the middle layer of the tri-metal. It is for this reason that the cladding rollers are of a very large diameter so as to have a large surface contact with the tri-metal set thereby reducing the waviness.

The top and bottom surface 24 of the tri-metal set as previously indicated is copper. The outside layers of the copper are oxidized to prevent bonding between the sets 10, 12, 14 in the rolling mill 22 thereby allowing an increase in the throughput of the cladding mills. By so doing, the initial material stock is closer to the desired finish tolerances of the ETM sheet construction. The stresses in the material that are normally introduced by the cladding process are reduced. After the tri-metal sets 10, 12, 14 are removed from the rolling mill 22, the sets are separated and the copper oxide is removed.

Thus the method of FIG. 1 comprises the steps of first forming a stacked set of tri-metal material 10, 12, 14 having three layers of metal wherein the central layer 26 is one material and the top and bottom layers 24 are a second material.

The outside surfaces of the top and bottom layers 24 of each set of tri-metal material 10, 12, 14 are oxidized. In the preferred embodiment, the oxidizing layer is a copper oxidizing layer that will not adhere to the outside layer of another individual set of tri-metal materials.

Next each individual set of the tri-metal material is fed to a cladding mill 16, 18, 20 or roller to form a tri-metal cladded material. As each set of the tri-metal material leaves the cladding mill, they are positioned in an overlying manner on another set so that the oxidizing surfaces are adjacent to each other to create a multiple set of tri-metal cladded material sets.

The multiple sets are then supplied to a rolling mill 22 at a predetermined pressure and temperature for reducing the thickness of the multiple set of tri-metal cladded material.

After the multiple sets leave the rolling mill each individual set 10, 12, 14 of tri-metal cladded material is then separated from each other.

Figure 2:
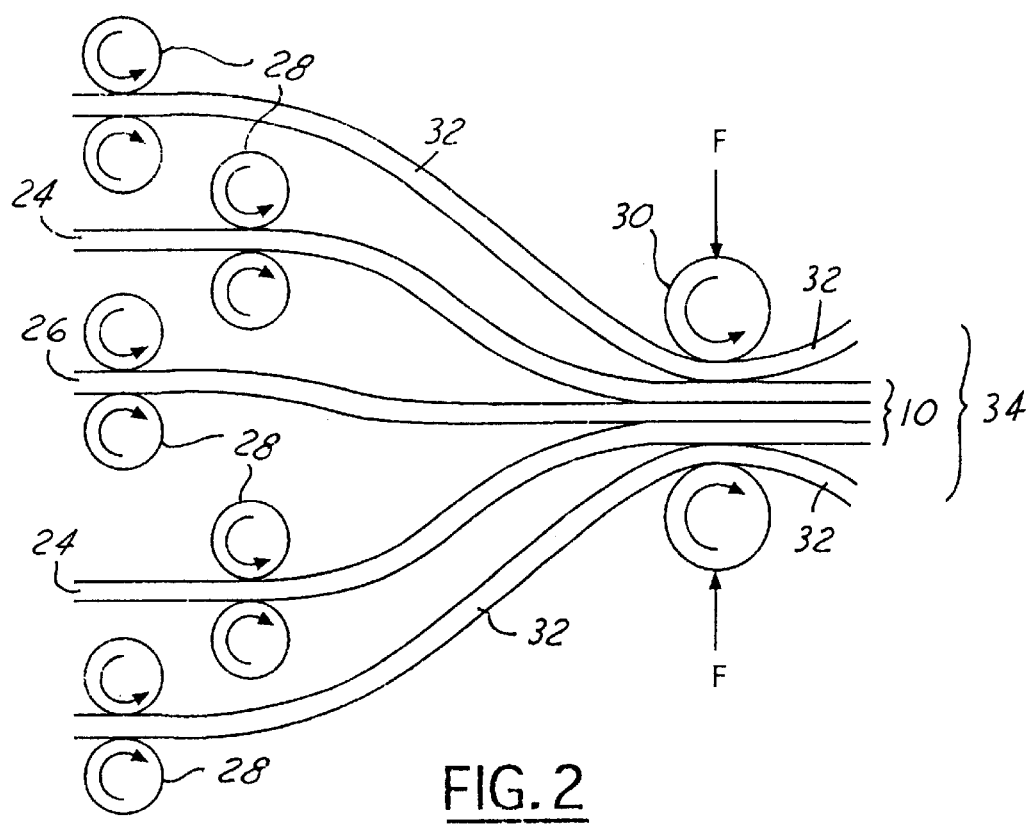
FIG. 2 is a schematic of cladding a tri-metal using removable layers.

Referring to FIG. 2, there is illustrated another embodiment of forming a set of tri-metal cladded material. As in the previous method, the individual sheets 24, 26 are supplied via rollers 28 to the clad mill 30. However, on the outside surface of both the top and bottom layer 24 is a removable layer 32. Again the tri-metal material 10 is formed of copper on the outside and aluminum in the middle.

The method illustrated in FIG. 2 for cladding material for etched-tri-metal circuits to maintain the dimensional tolerance and reducing the stresses in the cladded material. The method has the steps of individually rolling three layers 24, 26, 24 of metal wherein a central layer 26 is one material, such as aluminum, and the top and bottom layers 24 are a second material, such as copper, forming a tri-metal material 10.

On the outside surface of the top and bottom layer 24, a removable layer 32, such as tungsten, is added. The tri-metal material 10 with the two removable layers 32 forms a set of five-layer material 34 with the removable layers on the outside. The set of five-layer material 34 is supplied to a cladding mill 30 to clad the material at a predetermined pressure and temperature for cladding of the tri-metal material 10.

After the cladding, the set of five-layer material 34 is rolled at a predetermined pressure and temperature to a predetermined thickness and then the removable layers 32 are removed resulting in a tri-metal cladded material 10.

Figure 3:
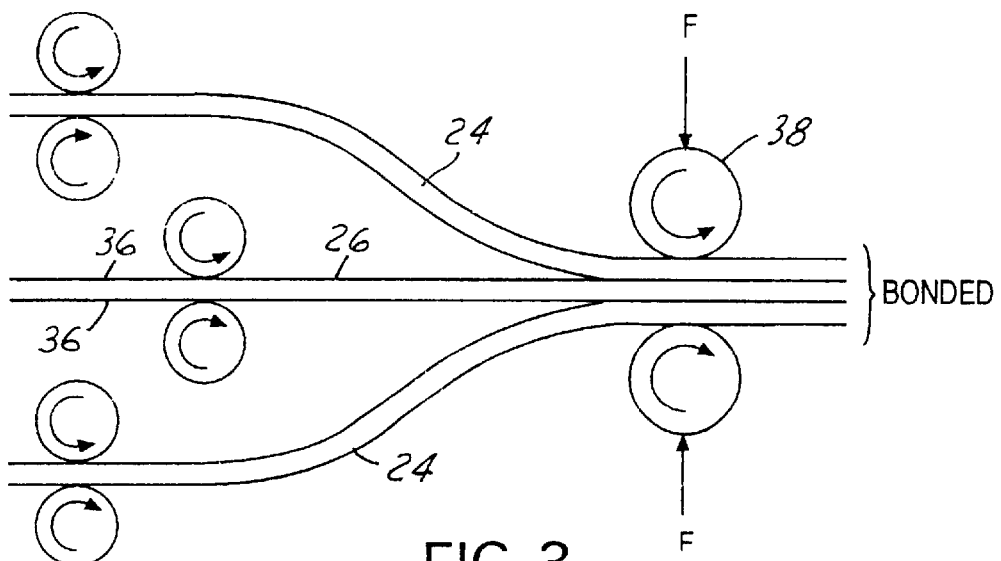
FIG. 3 is a schematic of cladding a tri-metal using a thin coating on each side of the middle layer.

Another embodiment is illustrated in FIG. 3. In this embodiment, the outer broadside surfaces of the central material 26 are coated with a thin layer 36 of a bonding metal such as silver or tin or an aluminum alloy before the material is supplied to the cladding mill 38. After applying the bonding layer 36, the outer layers 24 are placed on the bonding layer 36 for bonding to the central layer 26. In the alternative, the inside surfaces of the outer layers 24 may have the bonding material layer applied thereto. The tri-metal material set is then supplied to the cladding mill 38 to complete the bonding and to reduce the thickness of the layers.

This bonding material reduces or eliminates a brittle Cu/Al intermetallic formation. Thick Cu/Al intermetallics at the interface make the copper and aluminum layers debond after cladding. The thickness of the bonding layer 36 is on the order of microns and typically is less than three microns.

Other bonding metal layers that can be used to enhance the copper-aluminum bonding and to prevent or reduce intermetallic formation include tin, nickel, titanium, chromium, aluminum and zinc and any of their alloys. Any of these metals, including silver, can be deposited by any of the standard deposition techniques such as plating, cladding, sputtering, etc. These bonding metals amalgamate into the aluminum and are not recoverable.

As previously indicated, FIG. 4 illustrates the washboard effect with unacceptable variations in thickness of the copper and aluminum currently available.

As an example, the waviness of the outside surface 40 may be 0.0015 inches (0.0381 mm), the thickness of the copper layer 26 between 0.002 inches (0.580 mm) and 0.0035 inches (0.889 mm) and the peak to peak dimension 42 may be 0.100 inches (25.4 mm). An example of the material used in the method of FIGS. 1–3 is 3003 aluminum and 110 copper.

Figure 5:
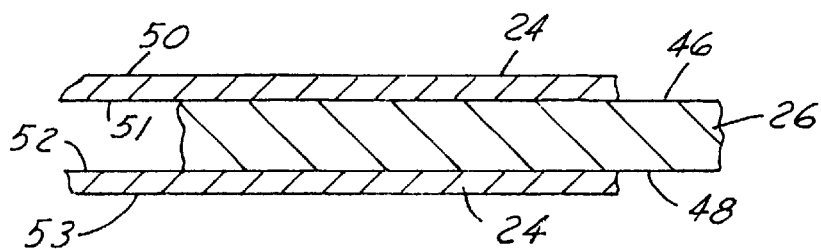
FIG. 5 is an enlarged section of a preferred embodiment of a tri-metal sheet with the metals identified.

Referring to FIG. 5 there is illustrated an etched-tri-metal sheet 44 having a central first metal layer 26 of aluminum having two broadside surfaces 46, 48. A pair of second metal layers 24 of copper each having two broadside surfaces 50–53 that are substantially identical in shape to the broadside surfaces 46, 48 of the first metal layer 26 overlie each of the broadside surfaces of the central layer forming a sandwich. A bonding material is interposed the broadside surfaces 46, 51 and 48, 52, of the first 26 and second 24 metal layers.

In one embodiment, the bonding material is coated on the broadside surfaces of the central metal layer 26. In another embodiment a removable layer 32 is positioned on the top 50 and bottom 53 outside broadside surface of the second metal layers 24. This removable layer 32 is fabricated from tin, tungsten forming a five-layer sheet 34.

The bonding material is selected from a group consisting of tin, nickel, titanium, chromium, silver and zinc. In addition the outside broadside surfaces 50, 53 of the copper is covered with a copper oxide for preventing stacked tri-metal sheet sets 10, 12, 14 from adhering to each other.

There has thus been shown and described a method for processing cladding material for etched-tri-metal circuits to maintain the dimensional tolerance and reducing the stresses in the cladded material and the resulting article of manufacture.

What is claimed is:

1. A method for cladding material for etched-tri-metal circuits to maintain the dimensional tolerance and reducing the stresses in the cladded material, the method comprises the steps of:

forming a stacked set of tri-metal material having three layers of metal wherein the central layer is one material and the top and bottom layers are a second material;

oxidizing the outside surface of the top and bottom layers of each set of tri-metal material;

individually cladding a plurality of sets of the tri-metal material forming a tri-metal cladded material;

overlying each set tri-metal cladded material on another set so that the oxidizing-surfaces are adjacent to each other to create a multiple set of tri-metal cladded material-sets; and then rolling the multiple set of tri-metal cladded material sets at a predetermined pressure and temperature for reducing the thickness of the multiple set of tri-metal cladded material.

2. The method according to claim 1 wherein the central layer is aluminum.

3. The method according to claim 1 wherein the top and bottom layers are copper.

4. The method according to claim 1 wherein the oxidizing surface is a copper oxidizing layer that will not adhere to either the top or bottom layer.

5. The method according to claim 1 additionally including the step of separating after the step of rolling each of the tri-metal cladded material sets from each other.

6. A method for cladding material for etched-tri-metal circuits to maintain the dimensional tolerance and reducing the stresses in the cladded material, the method comprises the steps of:

individually rolling three layers of metal wherein a central layer is one material and the top and bottom layers are a second material forming a tri-metal material;

adding a removable layer to the outside surface of the top and bottom layers of the tri-metal material;

cladding the tri-metal material with the removable layers forming a tri-metal cladded material with the removable layers on the outside forming a set of a five layer cladded material;

rolling the set of five-layer cladded material to a predetermined pressure and temperature for reducing the thickness of the tri-metal cladded material.

7. The method according to claim 6 additionally including the step of removing the removable layer after the step of rolling.

8. The method according to claim 6 wherein the removable layer is titanium.

9. A method for cladding material for etched-tri-metal circuits to maintain the dimensional tolerance and reducing the stresses in the cladded material, the method comprises the steps of:

securing a layer of first material having close tolerance thickness;

securing two layers of a second material wherein the inside surface of each of said second material overlays both the top and bottom surfaces of the first material forming a tri-metal material;

coating the inside surface of each of the second layers with a layer of bonding material;

and then cladding the tri-metal material and wherein the top and bottom layers are bonded to the middle layer.

10. The method according to claim 9 wherein the first material is aluminum, the second material is copper and the bonding material is silver.

11. The method according to claim 9 wherein the bonding material is selected from a group consisting of tin, nickel, titanium, chromium, silver and zinc.

* * * * *